United States Patent [19]

Siegmund et al.

[11] Patent Number: 4,966,647
[45] Date of Patent: Oct. 30, 1990

[54] METHOD FOR SINGLE SIDE SPRAY PROCESSING OF PRINTED CIRCUIT BOARDS

[75] Inventors: Arthur J. Siegmund, Hamden, Conn.; Henry E. Ladouceur, West Hampton, Mass.

[73] Assignee: Siegmund, Inc., Hamden, Conn.

[21] Appl. No.: 482,310

[22] Filed: Feb. 20, 1990

Related U.S. Application Data

[62] Division of Ser. No. 403,574, Sep. 6, 1989.

[51] Int. Cl.⁵ .................... B44C 1/22; C23F 1/00; C03C 15/00; C03C 25/06
[52] U.S. Cl. ....................... 156/640; 156/656; 156/902; 156/345
[58] Field of Search ............. 156/640, 656, 659.1, 156/664, 665, 666, 901, 902, 345; 134/32, 198

[56] References Cited

U.S. PATENT DOCUMENTS

| | | | |
|---|---|---|---|
| D. 241,159 | 8/1976 | Gurian et al. | D55/1 R |
| D. 241,160 | 8/1976 | Gurian et al. | D55/1 R |
| 2,895,814 | 7/1959 | Clark | 156/664 X |
| 2,995,851 | 8/1961 | Dirats | 156/345 X |
| 3,088,391 | 5/1963 | Sigler | 95/93 |
| 3,288,700 | 11/1966 | Needham et al. | 204/298 |
| 3,289,682 | 12/1966 | Naslund | 134/125 |
| 3,406,697 | 10/1968 | Mitchell et al. | 134/148 |
| 3,455,763 | 7/1969 | Sarka et al. | 156/345 |
| 3,663,724 | 5/1972 | Benton et al. | 156/345 |
| 3,935,041 | 1/1976 | Goffredo et al. | 156/18 |
| 3,986,911 | 10/1976 | Lerner | 156/644 X |
| 4,015,706 | 4/1977 | Goffredo et al. | 198/780 |
| 4,046,248 | 9/1977 | Goffredo et al. | 198/583 |
| 4,069,085 | 1/1978 | Buysman et al. | 156/640 X |
| 4,190,481 | 2/1980 | Goffredo | 156/345 |
| 4,364,801 | 12/1982 | Salama | 204/15 |
| 4,402,800 | 9/1983 | Ash et al. | 204/15 |
| 4,425,869 | 1/1984 | Hull | 118/314 |
| 4,479,849 | 10/1984 | Frantzen | 156/640 |
| 4,600,463 | 7/1986 | Aigo | 156/345 |
| 4,620,894 | 11/1986 | Gurian et al. | 156/345 |
| 4,781,205 | 11/1988 | Shakley | 134/131 |

FOREIGN PATENT DOCUMENTS

| | | | |
|---|---|---|---|
| 0843903 | 6/1970 | Canada | 149/1 |
| 0843904 | 6/1970 | Canada | 149/1 |
| 0843905 | 6/1970 | Canada | 149/1 |
| 0986262 | 3/1976 | Canada | 15/6 |
| 1350805 | 4/1974 | United Kingdom . | |
| 1378237 | 12/1974 | United Kingdom . | |

OTHER PUBLICATIONS

"Handbook of Printed Circuit Manufacturing", by Clark, 1985, Van Nostrand Reinhold Co. Inc., pp. 396-416.

"Printed Circuits Handbook", edited by Coombs, 1979, McGraw-Hill Book Co., pp. 8-1: 8-45.

*Primary Examiner*—William A. Powell
*Attorney, Agent, or Firm*—Perman & Green

[57] ABSTRACT

An apparatus and method for spraying a single side of a printed circuit board with a reactive spray. The apparatus comprises a conveyor table, spray nozzles located below the conveyor table and a protective cover above the conveyor table. The printed circuit boards to be sprayed are sandwiched between the cover and the conveyor table. The cover prevents reactive spray from contacting top sides of the printed circuit boards while also maintaining the boards against the conveyor table such that bottom sides of the boards can be sprayed without risk of reactive spray contacting the top sides of the boards or dislodging the boards from the conveyor table by the upwardly sprayed reactive spray.

3 Claims, 2 Drawing Sheets

METHOD FOR SINGLE SIDE SPRAY PROCESSING OF PRINTED CIRCUIT BOARDS

This is a divisional of copending application Ser. No. 403,574, filed on Sept. 6, 1989.

BACKGROUND OF THE INVENTION

1. Field of the Invention

The present invention relates to treating articles with reactive spray and, more specifically, to an apparatus and method for etching or otherwise chemically treating electronic printed circuit board substrates.

2. Prior Art

The art is replete with various disclosures of apparatus and methods of etching printed circuit board substrates. "Handbook of Printed Circuit Manufacturing" by Raymond H. Clark, 1985 Van Nostrand Reinhold Co., Inc., pp 396-416, discloses etching in detail. "Printed Circuits Handbook", second edition, by Clyde F. Coombs, Jr., 1979 McGraw-Hill, Inc. pp 8-8:8-45 also disclose etching. One type of etching technique is called spray etching. Spray etching techniques include single or double sided etching with either horizontal or vertical positioning of the printed circuit board substrate. In single side horizontal etchinq, it is known that spraying etchant upward onto a substrate can be used for producing very fine line work. There also exist automatic horizontal etching machines such as disclosed in U.S. Pat. Nos. 4,781,205; 4,190,481 and 3,935,041.

Various problems exist in the spray etching technology. Generally, uneven etching can result when both sides of a double sided printed circuit board substrate are etched simultaneously in either a horizontal or vertical spray etcher. In the vertical system, etching solution can run down the board causing uneven etching activity from the top of the board to the bottom. With the horizontal system, puddling of etchant can occur on the top side of the board causing different etching activity than on the bottom side. This problem has become more important as finer line geometries have been developed particularly in the range of line widths under 10 mils wide and, more particularly, to very fine line etching below 5 mils in line width.

It is therefore an objective of the present invention to provide an apparatus and method for etching printed circuit board panels with a substantially reduced risk of uneven etching.

It is another objective of the present invention to provide spray etching for very fine line etching.

It is another objective of the present invention to provide single side spray etching which can etch very fine lines on a first side of a printed circuit board panel, but can protect the panel's opposite second side from contact with the etchant.

It is another objective of the present invention to provide a means for preventing etchant sprayed upwardly against printed circuit board panels from dislodging or moving the panels upward away from the support conveyed.

It is another objective of the present invention to provide a mechanism according to the present invention that can be installed or adapted for use in horizontal spray etchers known in the art.

It is another objective of the present invention to provide a mechanism according to the present invention that can relatively easily be removed from and installed in sprayer apparatus.

It is another objective of the present invention to provide a mechanism according to the present invention that can provide a temporary mask for a whole side of an article being sprayed that can travel at the same speed as an article conveyor to prevent damage to the article being conveyed.

It is another objective of the present invention to provide a mechanism according to the present invention that can allow fine line etching of thin copper with relatively little undercut.

SUMMARY OF THE INVENTION

The foregoing problems are overcome and other advantages are provided by an apparatus and method for single sided spray processing of articles.

In accordance with one embodiment of the invention, an apparatus for treating an article with a reactive spray is provided. The article to be treated being relatively planar in shape and having a first bottom side and a second top side. The apparatus comprises a conveyor table means, a spray means, and a cover means. The conveyor table means is provided for transporting and supporting an article in a substantially horizontal plane. The table means has at least one aperture for the passage of reactive spray therethrough. The spray means is located below the table means for upwardly spraying reactive spray through the at least one aperture onto a bottom side of an article on the table means. The cover means is provided for covering a top side of an article on the table means for preventing reactive spray from contacting a top side of the article being sprayed and to prevent the article from being dislodged from the table means during spraying of reactive spray at the article's bottom side.

In accordance with another embodiment of the present invention, a horizontal circuit board etching machine is provided comprising support means, spray means and cover means. The support means has a top for supporting a circuit board thereon. The support means top has aperture means therethrough for passage of etching fluid. The spray means is located under the support means' top for upwardly spraying etching fluid through the aperture means onto a bottom side of a circuit board on the support means' top. The cover means is provided for covering a top side of a circuit board being sprayed. The cover means comprises a deformable belt of material resistant to etching fluid corrosion. The belt and the support means top are suitably oriented to sandwich a circuit board therebetween such that etching fluid can be sprayed onto a bottom side of a circuit board. The support means and the cover means can cooperate to substantially prevent a circuit board from being moved by etching fluid being sprayed thereon, and the cover means can substantially prevent etching fluid from substantially contacting a top side of a circuit board as its bottom side is being sprayed.

In accordance with one method of the invention, a method of treating a single side of a circuit board comprises the steps of positioning a circuit board in an etching chamber, the chamber having a horizontal conveyor table for transporting and supporting the circuit board thereon, means for spraying reactive spray upwardly against the conveyor table, and the protective covering belt located above the conveyor table, the circuit board being substantially sandwiched between the conveyor table and the covering belt with the covering belt substantially sealing the top side of the circuit board and substantially fixedly but movable holding the circuit board against the conveyor table; and spraying reactive spray upwardly through apertures in the conveyor table onto the bottom side of the circuit board to react therewith whereby reactive spray is substantially prevented from contacting a top side of the circuit board and reactive spray can relatively freely leave the circuit board.

BRIEF DESCRIPTION OF THE DRAWINGS

The foregoing aspects and other features of the present invention are explained in the following description, taken in connection with the accompanying drawings, wherein.

DETAILED DESCRIPTION OF THE INVENTION

Figure 1:
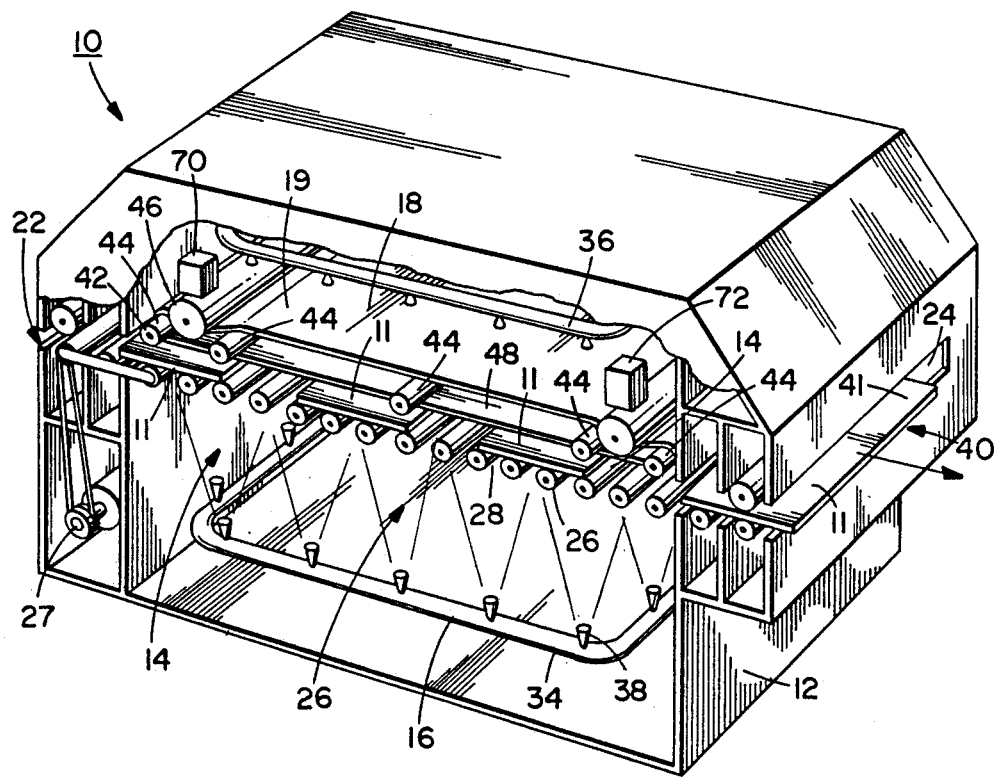
FIG. 1 is a cut away perspective view of a circuit board etching apparatus incorporating features of the present invention.
Figure 2:
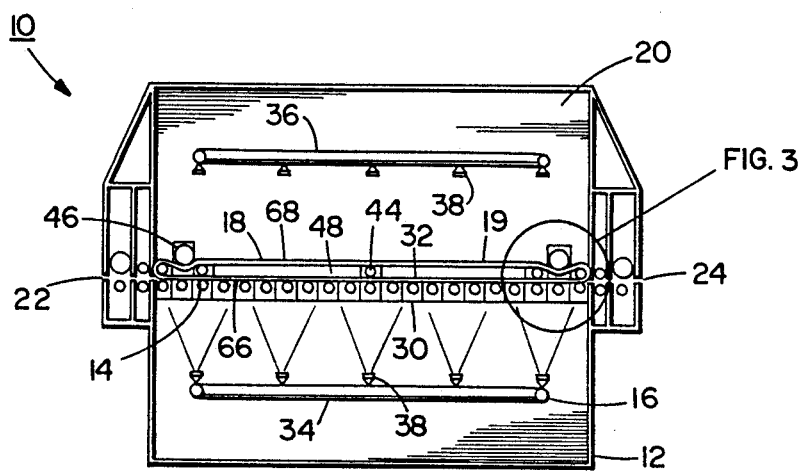
FIG. 2 is a schematic side view of the apparatus shown in FIG. 1.

Referring to FIGS. 1 and 2, a horizontal spray etching apparatus 10 for etching printed circuit boards 11 is shown. It should be understood that the present invention is not limited to etching printed circuit boards. The apparatus and method of the present invention can be used in any suitable chemical treatment process including developing, selective stripping of metal or other material from an article, or oxide treatment of articles. Reactive spray used to chemically treat an article may correspondingly be any type of reactive spray including etching fluid, developing fluid, oxidizing fluid, or reactive powder. Thus, the term "reactive spray" used herein in intended to include any suitable type of reactive material that can be sprayed at an article. In addition, although the present invention is described below as being used on a planar printed circuit board, the apparatus and method can be used on any suitable article including flexible printed circuits and non-planar boards such as molded boards. Thus, the term "circuit board" as used herein is intended to include any suitable type of article including, but not limited to, molded boards, flexible printed circuits and semiconductor substrates.

The apparatus 10 generally comprises a frame 12 forming an etching chamber 20. Located in the chamber 20 is a conveyor table 14, an etching fluid spray system 16 and a cover system 18. The frame 12 is a general box structure having a circuit board entrance 22 and a circuit board exit 24 as is generally known in the art. The conveyor table 14 is generally comprised of a plurality of rollers 26 which can rotate about their axes to convey circuit boards 11 from the entrance 22 through the etching chamber 20 to the exit 24. The boards 11 may be either single sided or double sided circuit boards; i.e.: intended to have metal removed or be etched on only one side or both sides thereof, respectively. A drive motor 27 is suitably connected to the rollers 26 to rotate them. In an alternate embodiment, the motor 27 can be located in a separate module coupled to the table 14 to eliminate possible corrosion from fluid in the treatment chamber. The rollers 26 are suitable spaced from each other such that apertures or spaces 28 are provided therebetween. The conveyor table 14 is general horizontally oriented having a general bottom side 30 and a general top side 32. In a preferred embodiment of the invention, the conveyor table 14 is a conventional conveyor table as is known in the art such as disclosed in U.S. Pat. No. 4,046,248 or U.S. Pat. No. 4,781,205. However, any suitable type of conveyor table 14 may be provided so long as the etching apparatus 10 can convey printed circuit boards 11 through the apparatus and such that the spray system 16 can spray etchant upward to contact the underside of the printed circuit boards 11 in the etching chamber 20 as will be described below.

The spray system 16, in the embodiment shown, is generally comprised of a bottom sprayer 34 and a top sprayer 36. Both the bottom and top sprayers 34 and 36 have a plurality of spray nozzles 38 which are directed towards the conveyor table 14. In the embodiment shown, the top sprayer 36 is generally not required because the apparatus 10 is intended for etching printed circuit boards 11 via the upward spray action of the bottom sprayer 34 only. However, as will be described below, the cover system 18 may be removed from the apparatus 10 such that the apparatus can be used for double side spray etching using both the bottom sprayer 34 and top sprayer 36. Because the apparatus 10 will be used only for single side etching when the cover system 18 is connected thereto, the top sprayer 36 can be disabled. Thus, printed circuit boards will only be etched from fluid emanating from the bottom sprayer 34 when the cover system 18 is connected to the apparatus as shown. The bottom sprayer 34 is generally located under the conveyor table 14 with its nozzles 38 directed in an upward direction such that when the bottom sprayer 34 is activated etchant or etching fluid will be sprayed upwardly towards the conveyor table 14. Because there are apertures 28 between the rollers 26 of the conveyor table 14 and the rollers 26 are moving the printed circuit boards 11 while spraying is occurring, etchant from the bottom sprayer 34 can pass through the apertures 28 and contact bottom sides 40 of the printed circuit boards 11. Top sides 41 of the printed circuit boards 11 in the chamber 20 are contacted by a belt 19 of the cover system 18 as will be described below. The spraying of etchant from underneath printed circuit boards 11 prevents pooling of etchant on the circuit boards because gravity generally causes the etchant sprayed on the boards 11 to be gravity fed off of the boards, back down towards the bottom sprayer 34 and thus allows for very fine line etching.

The cover system 18 is generally comprised of a continuous belt 19 of deformable flexible material which is resistant to etching fluid corrosion. In a preferred embodiment the belt 19 is comprised of reinforced polyvinylchloride (PVC). However, any suitable type of material which is deformable, flexible and resistant to etching fluid corrosion may be used. The belt 19 is preferably made of an inexpensive material and can be replaced when overstretched or found to be otherwise not suitable. The belt 19 can generally withstand the high temperatures of the apparatus 10 and is substantially impervious to the reactive spray. The cover system 18, in the embodiment shown, also generally comprises a belt support system 42 and a belt tension system 46. The belt support system 42, in the embodiment shown, generally comprises five rollers 44. However, any suitable number of rollers may be provided. In addition, extra rollers may be added to the system 18 to compensate for stretching of the belt 19. In addition, any suitable type of belt support system could be provided. In the embodiment shown, one roller 44 is located centrally and two pairs of rollers 44 arc located proximate the entrance 22 and exit 24 of the apparatus 10, respectively. The belt 19 generally forms an elongate closed loop 48. The rollers 44 are located inside the belt loop 48. Preferably, the diameter of the rollers 44 are equal to the diameter of the rollers 26 less twice the thickness of the belt 19 such that the belt 19 can travel at the same surface speed as the rollers 26, thus the belt can travel at the same speed as the boards being transported on the rollers 26. However, any suitable size rollers may be provided. The travel of the belt 19 at the same speed as the circuit boards may be particularly important in some processes such as developing so as not to damage the resist from any type of friction from the belt. In other processes, synchronization of belt travel with either article travel or conveyor table travel may not be important, or may not be desired. The belt 19 has a width generally equal to the length of the rollers 26 in the conveyor table 14 such that the belt can cover any circuit boards being transported on the table 14. The rollers 44 of the support system 42 are suitably spaced and the belt 19 is sufficiently large enough such that the belt 19 substantially covers the entire transporting span or length of the table 14 in the chamber 20. The flexible belt 19 is generally supported over or on top of the conveyor table 14 by means of the belt support system 42. The belt 19 can rotate in a path parallel to the path of conveyor table 14. Generally, the belt 19 and the conveyor table 14 can move the circuit boards in sequence with each other and thus the belt generally moves in registry with the circuit boards. Generally, the belt 19 rotates about its elongate loop 48 on its rollers 44 forming a top side 68 and a bottom side 66. The elongate top side 68 generally faces the top spray system 36. The elongate bottom side 66 generally faces the conveyor table 14. The elongate bottom side 66 can either be in close proximity to the conveyor table 14 or actually be held against the table 14 by the support system 42. Preferably, the rollers 44 are rubber-type friction rollers that contact the belt and frictionally drive the belt 19. Generally, the cover system 18 and conveyor table 14 are suitable oriented relative to each other such that circuit boards can be sandwiched therebetween. Because the belt 19 is comprised of a flexible and resilient material it can cover the top sides 41 of any boards located between the belt 19 and table 14 and can, at least partially, deform about the sides, of the boards to substantially seal off the top sides 41 to thereby substantially prevent etching fluid from contacting the top sides 41 while the bottoms sides 40 of the boards 11 are being etched. Because the belt 19 is flexible and resilient, it can be maintained in relatively taut contact against the boards, but nonetheless not cause any damage to the boards from such taut and compressive contact. As described above, upward spray etching of horizontally orientated boards is preferable when etching fine and very fine etch work. Thus, the bottom sides 40 of the boards 11 can be single side upwardly spray etched to form fine or very fine etch lines and the cover system 18 can prevent etchant from acting upon the top sides 41 of the boards 11. Thus, after the boards 11 have had their bottom sides 40 etched the boards can be advanced to another station or, because the top sides 41 have not been acted upon by etchant, the boards can be flipped over or reversed and reinserted into the apparatus 10 such that the former top sides 41 are now orientated in a downward direction and the former bottom sides 40, already etched, are now orientated in an upward direction. The cover system 18 can cover the etched former bottom sides thereby preventing further etching while the former top sides of the boards 11 are single sided upwardly spray etched by the bottom sprayer 34. Thus, both sides 40 and 41 of the boards 11 can be etched separately and produce fine or very fine etched lines without substantial risk of pooling of etchant or over etching. The belt support system 42 may provide for the belt 19 to have relatively free rotational movement thereon. However, in a preferred embodiment of the invention, a suitable drive system (not shown) is provided to rotate the belt 19 in a path parallel to the conveyor table 14. In another preferred embodiment of the invention, the drive system for the belt 19 is suitably connected to the conveyor table drive system, 27 such that the movement of the belt 19 is coordinated with the movement of the rollers 26 to cooperatively feed printed circuit boards 11 therebetween. In the embodiment shown, the belt tensioning means 46 generally comprises two substantially identical mechanisms; a first tensioning mechanism 70 and a second tensioning mechanism 72. The first tensioning mechanism 70 is generally located proximate the entrance 22. The second tensioning mechanism 72 is generally located proximate the exit 24. The belt tensioning means 46 is provided such that the belt 19 is maintained relatively tautly with the belt support system 42.

Figure 3:
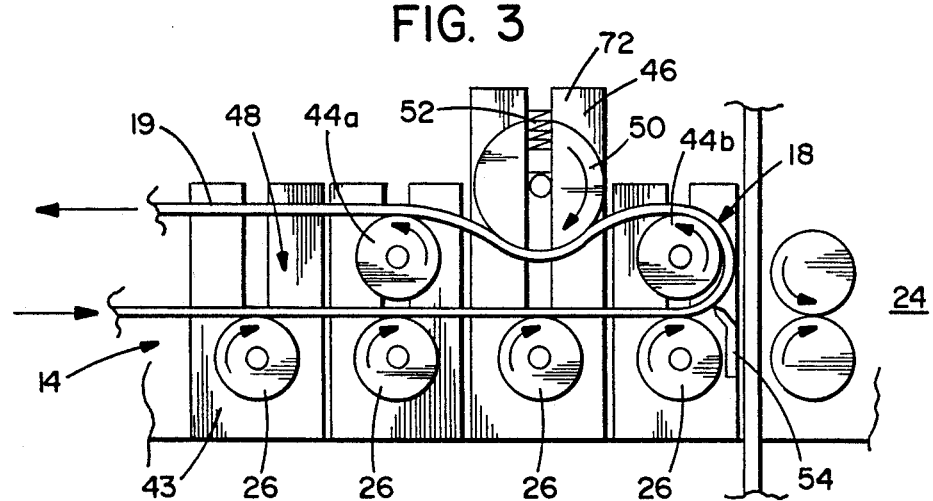
FIG. 3 is an enlarged partial side view of a portion of the apparatus shown in FIG. 2.

Referring also to FIG. 3, an enlarged partial view of the conveyor table 14, and cover system 18 is shown. As shown in this embodiment, located near the exit 24 the belt support system 42 generally comprises bearing blocks 43 and rollers 44a and 44b located inside the loop portion 48 of the belt 19. The second tensioning mechanism 72 generally comprises a roller 50 located outside the loop portion 48 of the belt 19 positioned against the outer surface of the belt 19 in an area generally between the two belt support system rollers 44a and 44b. The belt tensioning means also generally comprises means 52 for biasing the roller 50 against the outside face of the belt 19. A similar arrangement is provided proximate the entrance 22 as can be seen in FIGS. 1 and 2. With the two pairs of rollers 50 and biasing means 52 at opposite ends of the belt path, the belt 19 is maintained in a substantially taut engagement with the belt support system 42. The cover system 18 may be controlled by any suitable means including automatic or computer controlled means, or may have its belt 19 relatively free to rotate as described above. However, any suitable type of belt support system or belt tensioning means may be provided, In the embodiment shown in FIG. 3, the apparatus 10 also comprises an optional suitable squeegee means 54 for removing etchant from the belt 19. Because the belt 19 is held tautly against the circuit boards, the cover system 18 can also prevent circuit boards from being dislodged from the conveyor table 14 by the spray action of the etchant. Thus, the present invention can also allow for the force and quantitative flow of the etchant to be increased. A more intense spray action can also improve the etching rate. The present invention need not to used solely for producing fine line etching. The present invention can also be used during normal one sided etching.

Figure 4:
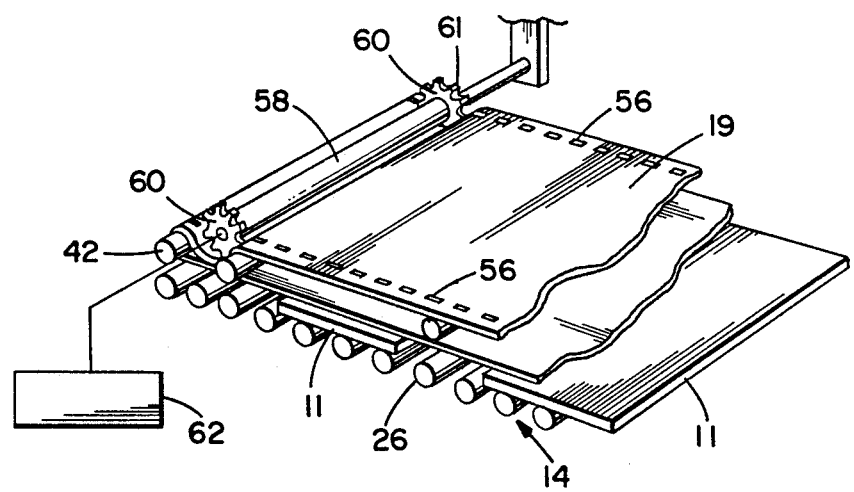
FIG. 4 is a partial perspective view of an alternate embodiment of the present invention.

Referring now to FIG. 4, a partial perspective view of an alternate embodiment of the invention is shown. In the embodiment shown, the belt 19 is generally provided with perforations 56 on its two sides. A suitable roller 58 having toothed portions 60 at its ends is connected to a drive system 62. The drive system 62 can rotate the roller 58 thereby rotating the toothed portions 60 whereby teeth 61 can cooperate with the perforations 56 on the belt 19 to accurately and precisely rotate the belt 19 on its belt support system 42.

Figure 5:
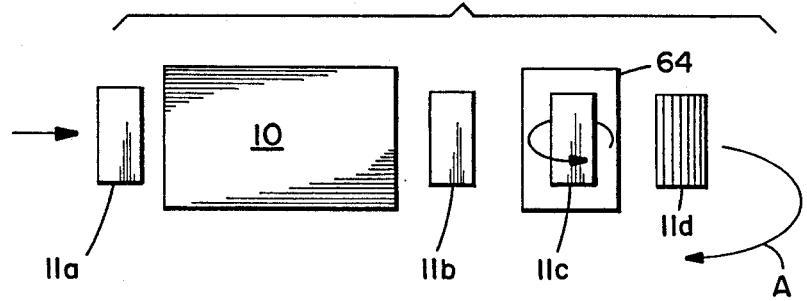
FIG. 5 is a schematic top view of an etching system incorporating features of the present invention.

Referring now to FIG. 5, there is shown a system for printed circuit board etching incorporating features of the present invention. The system generally comprises a single side spray etching apparatus 10, a printed circuit board flipper 64 and means for transporting circuit boards 11 between the etching apparatus 10 and flipper 64. Generally, an unetched printed circuit board 11a is inserted into the etching apparatus 10 wherein a single side of the board 11 is etched. Upon exit from the etching apparatus 10 the circuit board 11b, having had its underside etched is transported to the flipper 64. The flipper 64 is generally capable of flipping a board 180° such that a board 11c having had its underside etched is flipped 180° such that its etched underside is now in an upward position as shown with 11d.

Once flipped, the printed circuit board 11d can be transported back to the etching apparatus 10 as shown schematically at the arrow A such that its new unetched underside may be etched. Thus, the system shown in FIG. 5 is capable of using single side etching to produce a dual side etched circuit board which nonetheless has relatively fine line work etching on both sides thereof. Alternatively, a second etching apparatus may be provided in line after the flipper 64 to perform the second side etching. One potential disadvantage of single sided etching of a substrate is that it can take about twice the time to etch both sides of a double sided substrate than when simultaneously etching both sides of a double sided substrate with a double sided spray apparatus. One possible method of overcoming this potential disadvantage is to reduce the time it takes to etch a single side. One possible way to reduce the time it takes to etch a single side of a substrate is to use substrates having thinner thicknesses of metal on the substrates, such as using substrates having 0.7 mils thick of Copper instead of substrates having 1.4 mils thick of Copper or using substrates having 0.35 mils thick of Copper rather than substrates having 0.7 mils thick of Copper. By using substrates having about half the amount of metal, or less, the time for etching a substrate can be reduced in half or more. Because there is a substantially reduced risk of pooling of reactive spray on a substrate, undercut is substantially reduced which allows for the use of the substrates having thinner metal thicknesses. However, any suitable means or method could be used to reduce the etching time if desired.

Although the present invention is primarily described with reference to the embodiments shown in the drawings, various alternatives and/or modifications may be incorporated into the invention. The belt 19 need not be provided as a continuous belt, but may be provided as a noncontinuous belt fed from a suitable storage area and, after use, fed to a second suitable storage area. The table 14 need not be provided as a self-driven conveyor table. The belt 19 may be capable of primarily feeding the boards through the etching chamber 20. The cover system 18 may be provided as vertically movable to allow for relatively easy access between the belt 19 and conveyor table 14 for maintenance or repair. The cover system 18 is preferably removable from the etching apparatus 10 such that the apparatus 10 can still be used for simultaneous double side etching when fine etching is not required. The cover system 18 can be installed and used in prior art horizontal double side spray etchers with little modification. In addition, the cover system can also be adapted for use in vertical spray etchers. The cover system 18 can also be used for machines to merely hold articles in a relatively fixed position and need not be provided as a protective barrier for a side of an article such as when only one side of an article is intended to be or can be treated or processed.

It should be understood that the foregoing description is only illustrative of the invention. Various alternatives and modifications can be devised by those skilled in the art without departing from the spirit of the invention. Accordingly, the present invention is intended to embrace all such alternatives, modifications and variances which fall within the scope of the appended claims.

What is claimed is:

1. A method of treating a single side of an at least partially conductive substrate comprising the steps of:

positioning a substrate in a treatment chamber, the chamber having a horizontal conveyor table for transporting and supporting the substrate thereon, means for spraying reactive spray upwardly towards the conveyor table, and a protective covering belt located above the conveyor table, the substrate being substantially sandwiched between the conveyor table and the covering belt with the covering belt substantially sealing a top side of the substrate and substantially fixedly but movably holding the substrate against the conveyor table; and spraying reactive spray upwardly through aperture in the conveyor table onto a bottom side of the substrate to react therewith whereby reactive spray is substantially prevented from contacting a top side of the substrate and reactive spray can relatively freely leave the substrate after contact therewith.

2. A method of etching a single side of an at least partially conductive substrate comprising the steps of:

positioning a substrate in a treatment chamber, the chamber having a horizontal table for supporting the substrate thereon, means for spraying reactive spray upwardly towards the table, and a protective covering belt located above the table, the substrate being substantially sandwiched between the table and the covering belt;

spraying reactive etchant upwardly through apertures in the table onto a bottom side of the substrate; and preventing etchant from contacting a top side of the substrate with the covering belt substantially sealing the substrate top side such that a bottom side of the substrate is etched with etchant being gravity feed off of the substrate relatively quickly and without pooling of etchant on the substrate.

3. A method as in claim 2 wherein the step of positioning prevents the substrate from vertically moving off of the table while being sprayed because of the substantially sandwiched configuration of the substrate.

* * * * *